United States Patent [19]

McAnany

[11] Patent Number: 5,090,927
[45] Date of Patent: Feb. 25, 1992

[54] CONNECTORS INCLUDING LEAD ALIGNMENT STRIPS

[75] Inventor: Robert E. McAnany, Kansas City, Mo.

[73] Assignee: AT&T Bell Laboratories, Murray Hill, N.J.

[21] Appl. No.: 722,075

[22] Filed: Jun. 27, 1991

[51] Int. Cl.⁵ .................... H01R 13/46; H01R 13/44
[52] U.S. Cl. ................................. 439/892; 29/739; 439/140; 439/149
[58] Field of Search ............... 439/140, 149, 150, 248, 439/260, 325, 445, 526, 892, 893; 29/739

[56] References Cited

U.S. PATENT DOCUMENTS

| | | | |
|---|---|---|---|
| 4,394,795 | 7/1983 | Goso | 439/892 |
| 4,427,249 | 1/1984 | Bright et al. | 439/892 |
| 4,533,188 | 8/1985 | Miniet | 439/892 |
| 4,776,804 | 10/1988 | Johnson et al. | 439/892 |
| 4,872,845 | 10/1989 | Korsunsky et al. | 439/526 |
| 4,894,031 | 1/1990 | Damon et al. | 439/82 |

FOREIGN PATENT DOCUMENTS 2008342  9/1971  Fed. Rep. of Germany ...... 439/892
2208759A 4/1989  United Kingdom .............. 439/149

OTHER PUBLICATIONS

Apgar et al., Connector Aligner Aid, Jun. 1983, IBM Technical Disclosure Bulletin, vol. 26, No. 1, p. 218.

Primary Examiner—Paula A. Bradley
Attorney, Agent, or Firm—Lester H. Birnbaum

[57] ABSTRACT

Disclosed is a means for aligning contact leads in electrical connectors. An alignment strip includes a pair of slidably mounted sheets, each defining an array of openings having wide and narrow portions. The sheets are initially positioned so that the wide portions of corresponding openings in the two arrays overlap to permit easy insertion of the leads. The sheets are then shifted to align the narrower portions of the corresponding openings so that the leads are held in place in their proper location.

11 Claims, 4 Drawing Sheets

CONNECTORS INCLUDING LEAD ALIGNMENT STRIPS

BACKGROUND OF THE INVENTION

This invention relates to electrical connectors.

Many types of electrical connectors, such as the edge card connector, include a plurality of compliant pins, or leads, protruding from an insulating housing. In order for the leads to be inserted accurately into the holes in a board or backplane, it is necessary to keep them properly aligned with each other and with the holes in the board. The present method of maintaining this alignment is to comb the leads into place, and then insert them in holes in a thin plastic sheet such as Mylar ®.

While this technique is adequate for most present connectors, future designs will require a denser array of leads. In such cases it will be difficult to provide a comb small enough to fit within the spaces between the leads while, at the same time, rigid enough to hold the alignment for insertion in the Mylar ® sheet.

It is, therefore, an object of the invention to provide a means for aligning the leads of an electrical connector.

SUMMARY OF THE INVENTION

This and other objects of the invention are achieved in accordance with the invention which, in one aspect, is an electrical connector including a plurality of electrical leads. An alignment strip is provided which comprises two sheets, each with an array of openings therein. Each opening includes relatively wide and narrow portions. The two sheets are aligned so that the narrow portions of corresponding openings in the arrays overlap to form narrow apertures through the sheets with leads inserted and held therein.

In accordance with another aspect, the invention is a method for aligning a plurality of leads in an electrical connector. An alignment strip is provided comprising two slidably mounted sheets each defining an array of openings therein. Each opening has relatively wide and narrow portions. The sheets are aligned so that the wide portions of corresponding openings in the two arrays overlap to form wide apertures through the two sheets. Each lead is inserted into a corresponding aperture. The sheets are then re-aligned so that the narrow portions of corresponding openings in the two arrays overlap to form narrow apertures through the two sheets which hold the leads in place.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
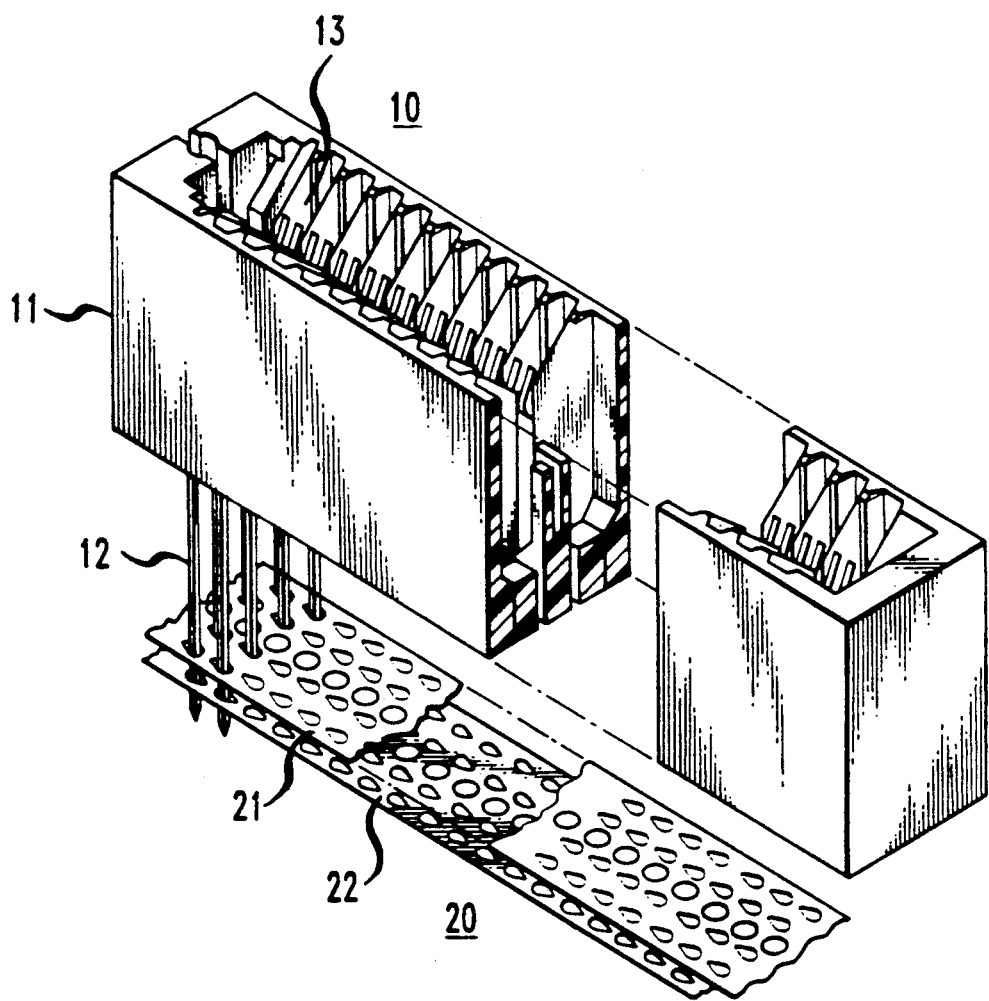
FIG. 1 is a perspective view of an electrical connector including an alignment strip in accordance with an embodiment of the invention.

FIG. 1 illustrates a typical edge card connector, 10, which includes the alignment strip, 20, in accordance with the invention. While an edge card connector is shown and described for illustrative purposes, it will be appreciated that the invention can be used with any electrical connector requiring lead alignment.

The edge card connector includes an insulating housing, 11, from which protrude a plurality of conductive leads, e.g., 12. As known in the art, a circuit card (not shown) is inserted in the slot, 13, in the housing in order to make electrical contact with the leads. The leads are then inserted in holes in a board or backplane (not shown) to interconnect the circuit card with other components.

Figure 2:
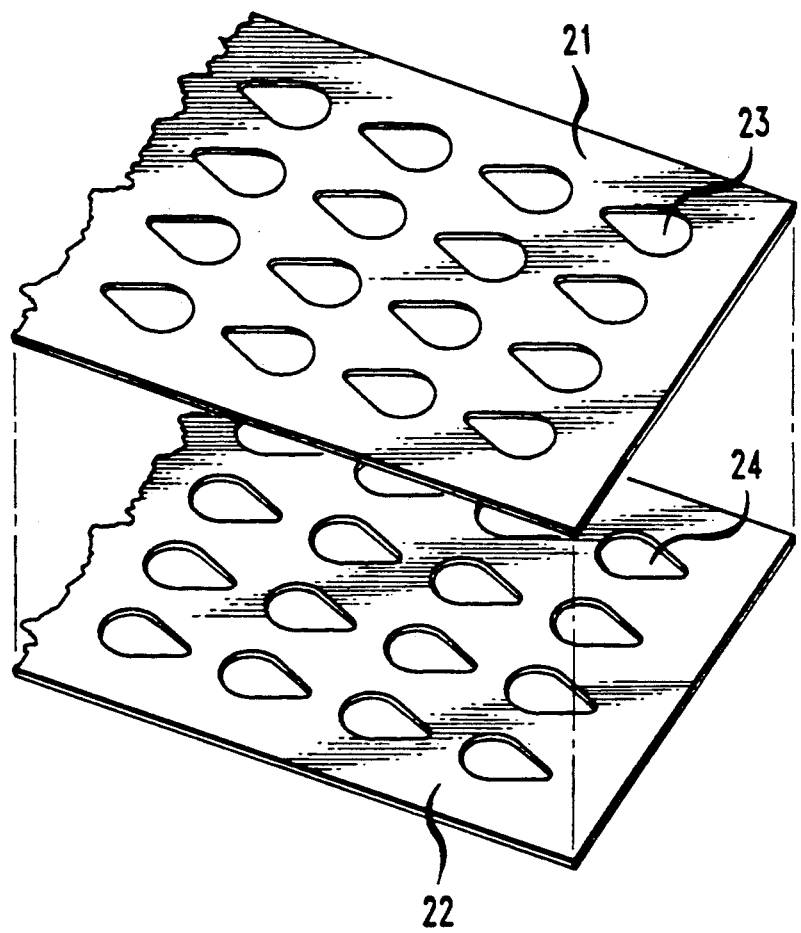
FIG. 2 is an enlarged, exploded view of a portion of the alignment strip in accordance with the same embodiment.
Figure 3:
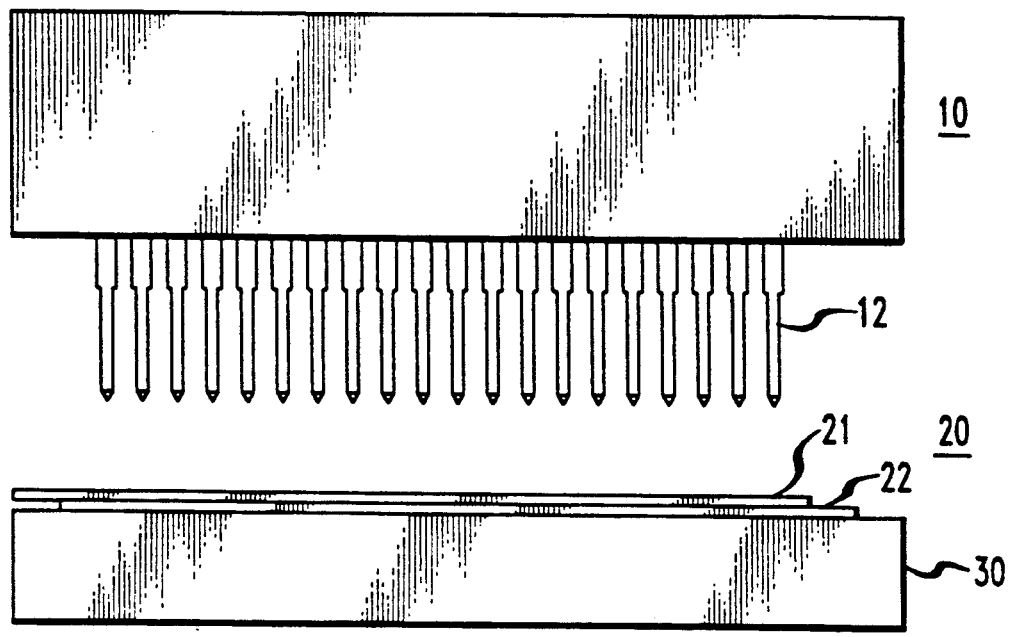
FIG. 3 is a side view of a connector and apparatus for inserting the leads into apertures in the alignment strip.

In order to align the leads with the holes in the board, an alignment strip, 20, is provided. With further reference to FIG. 2, it will be noted that the strip includes a pair of sheets, 21 and 22, typically made of Mylar ® or other plastic. Each sheet includes an array of openings therein, e.g., 23 and 24, and each opening includes relatively wide and narrow portions. In this example, the openings are "tear" shaped, where the width at the widest portion is typically 2.5 mm and tapers down to a width of 0.50 mm at its narrowest portion. In general, the widths at the widest and narrowest portions should be in the range 2-5 mm and 0.25-1.50 mm respectively.

The sheets 21 and 22 are arranged so that each opening, e.g., 23, in one sheet, 21, overlaps with a corresponding opening, 24, in the other sheet, 22, to provide an aperture through which a lead, e.g., 12, may be inserted. The corresponding openings in the two sheets, however, are asymmetric since the wide and narrow portions of the openings in one sheet are disposed opposite to those of the openings in the other sheet as shown. The advantage of this feature will be discussed below. The two sheets, 21 and 22, are fed to the assembly station by separate reels so that they can slide with respect to each other.

The leads may be inserted through the apertures in the alignment strip in the manner indicated in FIGS. 3-6. The alignment strip, 20, is placed on a positioning block 30 which is typically made of hardened, polished steel. The block includes an array of holes corresponding in number and position to the leads of the connector. One of these holes is shown as 31 in FIG. 4. It will be noted that the holes, e.g., 31, include a chamfered opening to ease the insertion of the leads therein.

Figure 4:
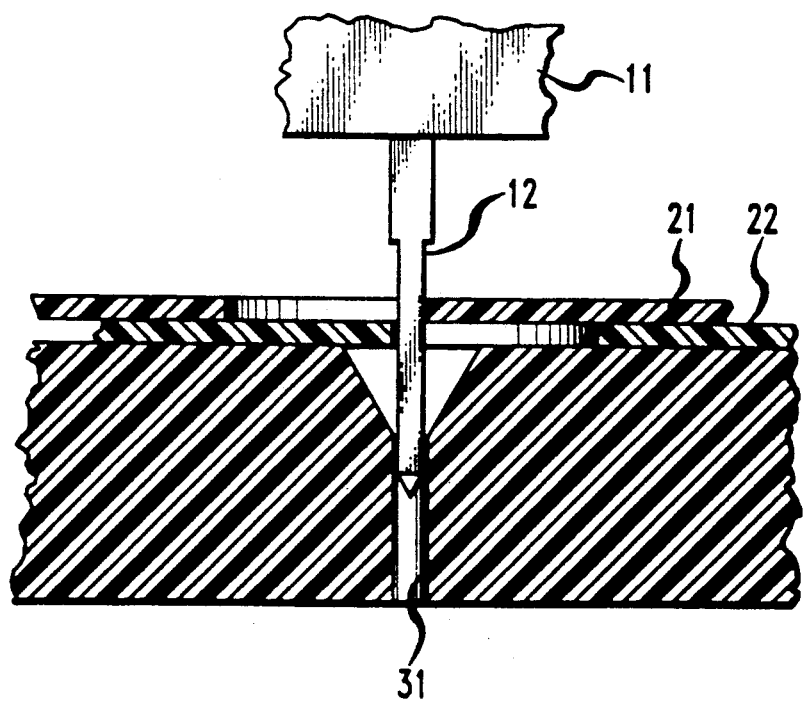
FIG. 4 is an enlarged cross-sectional view of a portion of the apparatus of FIG. 3.
Figure 5:
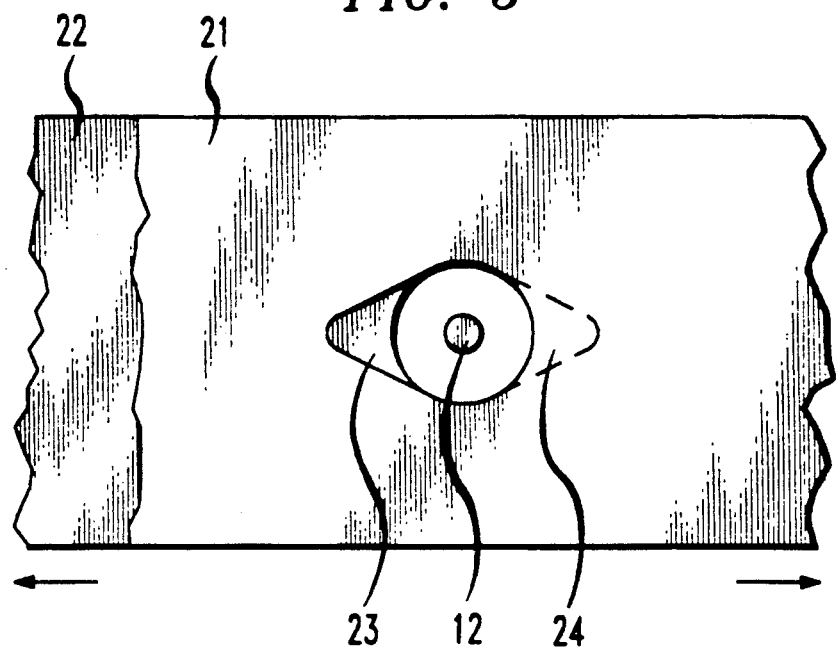
FIGS. 5 and 6 are enlarged top views of a portion of the alignment strip of FIGS. 1 and 2.
Figure 6:
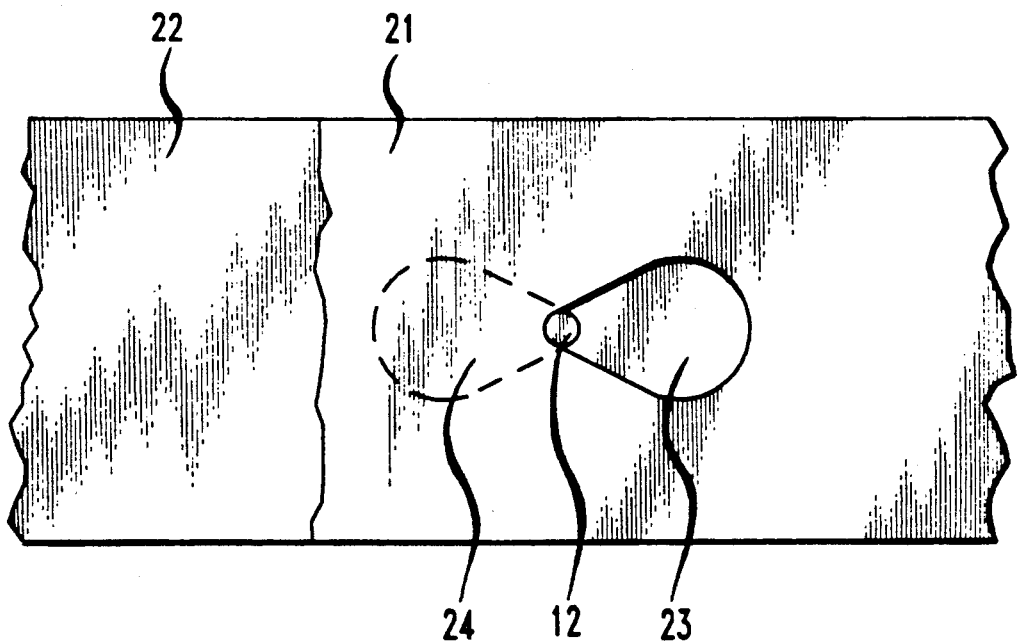

The two sheets, 21 and 22, are initially positioned, as shown in FIG. 5, such that the wide portions of corresponding openings, e.g., 23 and 24, overlap to produce a wide aperture for lead insertion. Thus, returning to FIG. 3, as the positioning block is raised upward, each pin will be inserted through an associated wide aperture and into a hole, e.g., 31, in the positioning block 30. This is the condition illustrated for one lead, 12, in the top view of FIG. 5. Next, as illustrated in FIGS. 4 and 6, the two sheets 21 and 22 are slid in opposite directions (as illustrated by the arrows in FIG. 5) so that the narrow portions of the corresponding openings, e.g., 23 and 24, now overlap. This holds the lead, e.g., 12, between the boundaries of the narrow end of each corresponding opening. The two sheets, 21 and 22, are then held permanently in this position, for example, by heat staking or by ultrasonic bonding in order to fix the alignment of the leads. The positioning block is then removed, with the leads maintained in alignment by the strip 20. If desired, any protruding edges of the sheets 21 and 22 can be removed to give a uniform edge for the strip 20.

The sheets, 21 and 22, would typically have a thickness in the range 0.05-0.25 mm in order to provide sufficient rigidity to hold the alignment of the leads.

Various modifications of the invention will become apparent to those skilled in the art. All such variations which basically rely on the teachings through which the invention has advanced the art are properly considered within the scope of the invention.

I claim:

1. An electrical connector comprising:
   a plurality of leads; and
   an alignment strip comprising two sheets each with an array of openings therein, each opening including relatively wide and narrow portions, the two sheets being aligned so that the narrow portions of corresponding openings in the arrays overlap to form narrow apertures through the two sheets with leads inserted and held therein.

2. The device according to claim 1 wherein the connector is an edge card connector.

3. The device according to claim 1 wherein the openings are tear shaped, and the narrow and wide portions of the openings in one sheet are oriented in a direction opposite to the openings in the other sheet.

4. The device according to claim 1 wherein the sheets comprise plastic with thicknesses in the range of 0.05-0.25 mm.

5. The device according to claim 1 wherein the sheets are heat staked together.

6. The device according to claim 1 wherein the wide portions of the openings have widths in the range 2.0-5.0 mm and the narrow portions have widths in the range 0.25-1.50 mm.

7. A method for aligning a plurality of leads in an electrical connector comprising the steps of:
   providing an alignment strip comprising two slidably mounted sheets, each defining an array of openings, and each opening having a relatively wide and narrow portion,
   aligning the sheets so that the wide portions of corresponding openings in the two arrays overlap to form wide apertures through the two sheets;
   inserting each lead into a corresponding aperture; and
   re-aligning the sheets so that the narrow portions of corresponding openings in the two arrays overlap to form narrow apertures through the two sheets which hold the leads in place.

8. The method according to claim 7 wherein the sheets are heat staked together with the leads held in place in the narrow apertures.

9. The method according to claim 7 wherein the sheets are re-aligned by sliding the sheets in opposite directions.

10. The method according to claim 7 wherein the alignment strip is mounted on a positioning block which includes an array of holes corresponding in number and position to the leads, and the leads are inserted through the wide apertures and into the holes.

11. The method according to claim 10 wherein the holes in the positioning block are chamfered at a surface of the block.

* * * * *